(12) United States Patent
Lin et al.

(10) Patent No.: US 11,879,084 B2
(45) Date of Patent: Jan. 23, 2024

(54) PHOSPHATE PHOSPHOR, LIGHT EMITTING DEVICE, AND DETECTING DEVICE

(71) Applicant: Lextar Electronics Corporation, Hsinchu (TW)

(72) Inventors: Chun-Che Lin, Hsinchu (TW); Chun-Han Lu, Hsinchu (TW); Yi-Ting Tsai, Hsinchu (TW); Yu-Chun Lee, Hsinchu (TW); Tzong-Liang Tsai, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 399 days.

(21) Appl. No.: 17/103,972

(22) Filed: Nov. 25, 2020

(65) Prior Publication Data
US 2022/0098482 A1 Mar. 31, 2022

(30) Foreign Application Priority Data
Sep. 30, 2020 (TW) ................. 109134255

(51) Int. Cl.
*C09K 11/71* (2006.01)
*C09K 11/08* (2006.01)
*C09K 11/77* (2006.01)
*H01L 33/50* (2010.01)

(52) U.S. Cl.
CPC .......... *C09K 11/717* (2013.01); *H01L 33/502* (2013.01)

(58) Field of Classification Search
CPC ....... C09K 11/74; C09K 11/717; C09K 11/71; C09K 11/7709; C09K 11/7708; C09K 11/771; C09K 11/0855; C09K 11/0861; C09K 11/0872; H01L 33/502
See application file for complete search history.

(56) References Cited

FOREIGN PATENT DOCUMENTS

| CN | 102051176 A | 5/2011 |
|---|---|---|
| CN | 108424770 A | 8/2018 |
| CN | 108982405 A | 12/2018 |
| CN | 109943330 A | 6/2019 |
| CN | 110003909 A | 7/2019 |
| CN | 110093160 A | 8/2019 |
| TW | 201903127 A | 1/2019 |

OTHER PUBLICATIONS

Malysa, "Temperature dependent photoluminescence of Cr3+ doped Sr8MgLa(PO4)7", Optical Materials 85, pp. 341-348. (Year: 2018).*

(Continued)

*Primary Examiner* — Matthew E. Hoban
*Assistant Examiner* — Lynne Edmondson
(74) *Attorney, Agent, or Firm* — CKC & Partners Co., LLC

(57) ABSTRACT

In the present disclosure embodiments, a phosphate phosphor including an activation center of trivalent chromium and a light emitting device are provided. The light emitting device includes a light source and the above mentioned phosphate phosphor, such that the phosphate phosphor is excited by the light source and emits a wide spectrum of the infrared light. The light emitting device with wide emission spectrum of the infrared light may be widely applied in detecting devices.

15 Claims, 4 Drawing Sheets

(56) References Cited

OTHER PUBLICATIONS

Xiaoling Dong et al., "New orange-red phosphor Sr9Sc(PO 4) 7 :Eu3+ for NUV-LEDs application", Journal of Alloys and Compounds 587 (2014) 493-496, Oct. 26, 2013.
Malysa, Beata, Andries Meijerink, and Thomas Jüstel., "Temperature dependent photoluminescence of Cr3+ doped Sr8MgLa (PO4) 7.", Optical Materials, vol. 85 , Nov. 2018, pp. 341-348.
Kim, Dorim, et al., "Theoretical design and characterization of high efficient Sr9Ln (PO4) 7: Eu2+ phosphors.", Materials Research Bulletin, vol. 127, Jul. 2020, p. 110856.
Deyneko, D. V., et al., "Structural changes in Sr 9 In (PO 4) 7 during antiferroelectric phase transition.", Inorganic Materials, vol. 52, Issue 2, Feb. 2, 2016, pp. 176-185.
Beata Malysa et al., "Temperature dependent photoluminescence of Cr3+ doped Sr8MgLa(PO4)7", Optical Materials, Sep. 7, 2018, 85:341-348.
Qingxiu Wei, "Spectral Regulation of β-Ca3 (PO4) 2 Type Phosphor Based on Ion Substitution and Energy Transfer", Chinese Master's Theses Full-text Database Information Science and Technology, 2019, 8: 1135-1143, ISSN 1674-0246 CN 11-9144/G.

\* cited by examiner

PHOSPHATE PHOSPHOR, LIGHT EMITTING DEVICE, AND DETECTING DEVICE

CROSS-REFERENCE TO RELATED APPLICATION

This application claims priority to Taiwan Application Serial Number 109134255, filed Sep. 30, 2020, which is herein incorporated by reference in its entirety.

BACKGROUND

Field of Invention

The present disclosure relates to a phosphor. More particularly, the present disclosure relates to a phosphate phosphor and a light emitting device and a detecting device including the phosphate phosphor.

Description of Related Art

The technology application of the infrared light is continuously booming nowadays. The infrared light may be applied in the security monitor, biometrics (for example, iris, face, or fingerprint recognition), digital healthcare (for example, heartbeat or oximetry sensing), the infrared light touch panel, the near infrared light spectrometer, the eye tracking technology of augmented reality (AR) or virtual reality (VR), the automotive sensor, the automotive LiDAR, the drone, the plant growing light, or the like.

Conventional infrared light sources include the near infrared light spectrometer, the tungsten lamp, the Nernst glower, and the mercury arc. Although the above mentioned conventional light sources have wide spectrums of the infrared light, these light sources also have disadvantages such as large volume, low stability of spectrum, high power consumption, short life, and massive heat generation. On the other hand, the phosphor-converted infrared light-emitting diode (pc-IR LED) combines the infrared phosphor with a light source, which provides the advantage of small volume. However, the low efficiency and the narrow spectrum of the pc-IR LED restrict its application.

SUMMARY

According to some embodiments, the disclosure provides a phosphate phosphor including an activation center of trivalent chromium, where the phosphate phosphor emits an infrared light after being excited by a light source.

According to some embodiments, the disclosure provides a light emitting device including a light source emitting a light and a phosphate phosphor with an activation center of trivalent chromium. The phosphate phosphor emits an infrared light after being excited by the light.

According to some embodiments, the disclosure provides a detecting device including a light emitting device emitting an infrared light and a sensing device receiving the infrared light after external absorption or reflection. The light emitting device includes a light source emitting a light and a phosphate phosphor with an activation center of trivalent chromium, and the phosphate phosphor emits the infrared light after being excited by the light.

BRIEF DESCRIPTION OF THE DRAWINGS

The disclosure can be more fully understood by reading the following detailed description of the embodiment, with reference made to the accompanying drawings as follows. It is noted that various features are not drawn to scale. In fact, the dimensions of the various features may be arbitrarily increased or reduced for clarity of discussion.

DETAILED DESCRIPTION

Figure 1:
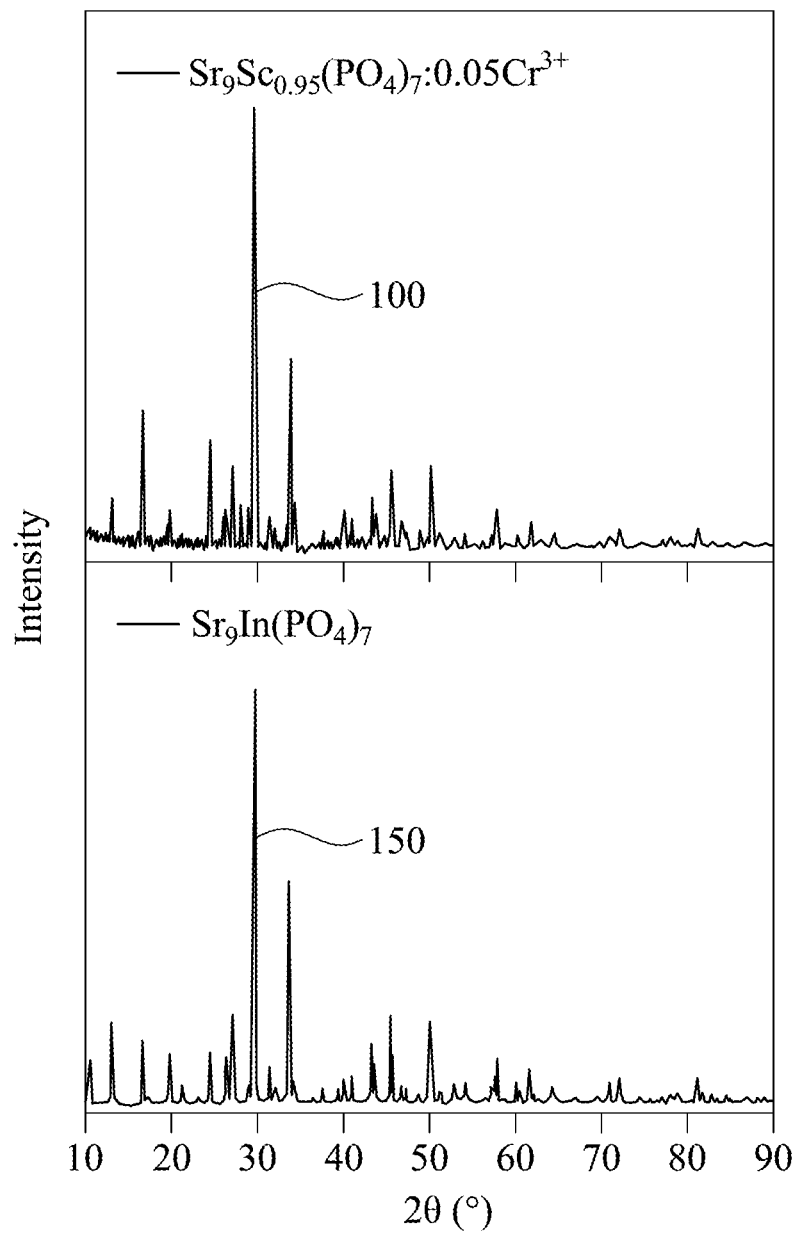
FIG. 1 illustrates X-ray diffraction spectrums of the phosphate phosphor according to some embodiments.

The following disclosure provides many different embodiments for implementing different features of the provided subject matter. Specific examples of components, values, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the embodiments of the disclosure, a phosphate phosphor which may be applied in a light emitting element is provided. The phosphate phosphor provides high efficiency and a wide spectrum of the infrared light, which further increases the applicability of the light emitting element and the infrared light detecting device.

According to some embodiments of the disclosure, a phosphate phosphor which has an activation center at least including trivalent chromium ($Cr^{3+}$) is provided. In some embodiments, the phosphate phosphor may include one activation center of trivalent chromium. In some embodiments, the phosphate phosphor may include more than one activation center, and at least one of the activation centers is trivalent chromium.

In some embodiments, the phosphate phosphor has a general formula $A_9B_{1-x}(PO_4)_7:xCr^{3+}$, and $0<x\leq1$. In some embodiments, the phosphate phosphor has the general formula $A_9B_{1-x}(PO_4)_7:xCr^{3+}$, where x may be 0.05, 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, or 1.

In some embodiments, the phosphate phosphor has the general formula $A_9B_{1-x}(PO_4)_7:xCr^{3+}$, where A may include $Be^{2+}$, $Mg^{2+}$, $Ca^{2+}$, $Sr^{2+}$, $Ba^{2+}$, or the like, or combinations thereof, and B may include $Al^{3+}$, $Ga^{3+}$, $In^{3+}$, $Sc^{3+}$, $Y^{3+}$, $La^{3+}$, or the like, or combinations thereof. For example, the phosphate phosphor may include $Be_9Al_{1-x}(PO_4)_7:xCr^{3+}$, $Mg_9Ga_{1-x}(PO_4)_7:xCr^{3+}$, $Ca_9In_{1-x}(PO_4)_7:xCr^{3+}$, $Sr_9Sc_{1-x}(PO_4)_7:xCr^{3+}$, or $Ba_9Y_{1-x}(PO_4)_7:xCr^{3+}$, or the like.

According to some embodiments of the disclosure, a method of forming the above mentioned phosphate phosphor is provided. The following embodiment of forming the phosphate phosphor $Sr_9Sc_{1-x}(PO_4)_7:xCr^{3+}$ will be taken as an example for ease of description. However, it should be appreciated that the method disclosed by this disclosure may be applied in forming other phosphate phosphors and is not limited to the described embodiment.

In some embodiments, chemical agents $SrCO_3$, $Sc_2O_3$, $NH_4H_2PO_4$, and $CrO_3$ are added into the mortar according to the formula $Sr_9Sc_{1-x}(PO_4)_7:xCr^{3+}$, which the mole ratios of the elements of the chemical agents correspond to the element ratios of the formula. In other embodiments, other chemical agents providing Sr, Sc, P, or Cr may be added, and those alternative embodiments are in the scope of the disclosure.

In the following step, the chemical agents in the mortar are uniformly grinded and mixed to form a precursor powder. The precursor powder is disposed in an alumina crucible in a muffle furnace for sintering. In some embodiments, the sintering temperature may be in a range of 1300° C. to 1500° C., and the sintering time may be in a range of 4 hours to 8 hours. The sintering temperature and the sintering time may be adjusted according to different chemical agents. Therefore, the sintering temperature and time that are not in the above mentioned ranges are also in the scope of this disclosure.

In the following step, the powder after sintering is cooled to room temperature (for example, about 25° C.). The sintered powder is transferred into the mortar to be grinded and mixed again, and the powder after grinding is the phosphate phosphor $Sr_9Sc_{1-x}(PO_4)_7:xCr^{3+}$. In other embodiments, additional operations may be included before, during, or after the above mentioned operations, and the added chemical agents may further include additional chemical agents (for example, auxiliary). These embodiments of the methods are also in the scope of this disclosure.

According to some embodiments of the disclosure, FIG. 1 illustrates an X-ray diffraction spectrum 100 of the phosphate phosphor and an X-ray diffraction spectrum 150 of a reference material, which the intensity of the X-ray diffraction spectrums is depicted as arbitrary unit. As shown in FIG. 1, the reference material of the X-ray diffraction spectrum 150 is $Sr_9In(PO_4)_7$, and the phosphate phosphor of the X-ray diffraction spectrum 100 is $Sr_9Sc_{0.95}(PO_4)_7:0.05Cr^{3+}$. However, it should be appreciated that the features presented by the phosphate phosphor of the X-ray diffraction spectrum 100 may also be presented by other phosphate phosphor provided by the disclosure.

The X-ray diffraction spectrum 150 is a reference spectrum of previously known monoclinic structure. The characteristic peaks of the X-ray diffraction spectrum 100 are found to be the same as those of the X-ray diffraction spectrum 150 after comparison between the X-ray diffraction spectrum 100 and the X-ray diffraction spectrum 150. For example, the diffraction angles (2θ) of the X-ray diffraction spectrum 100 include 16.8°, 24.5°, 29.8°, 33.9°, and 50.2° in FIG. 1, and these diffraction angles also appear in the X-ray diffraction spectrum 150. In other words, the phosphate phosphor of the X-ray diffraction spectrum 100 and the reference material of the X-ray diffraction spectrum 150 have the same crystal structure. Therefore, the crystal structure of the phosphate phosphor is monoclinic.

Figure 2:
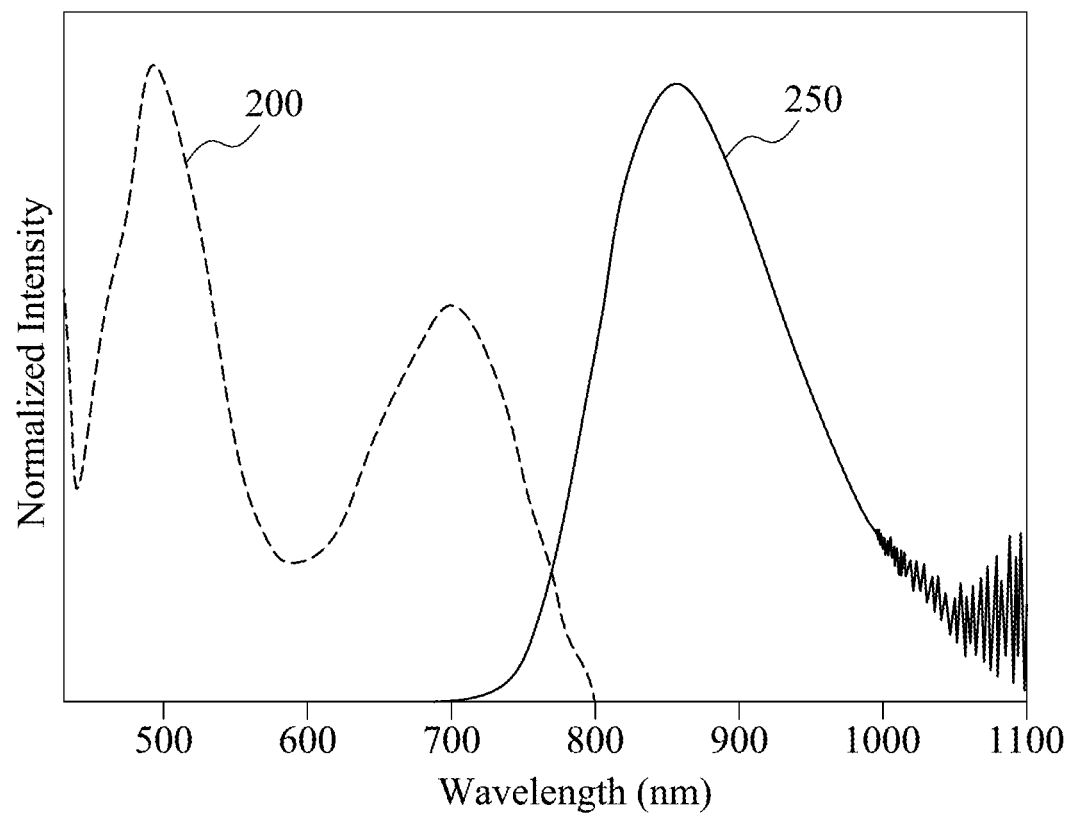
FIG. 2 illustrates an excitation spectrum and an emission spectrum of the phosphate phosphor according to some embodiments.

According to some embodiments of the disclosure, FIG. 2 illustrates an excitation spectrum 200 and an emission spectrum 250 of the phosphate phosphor, which the normalized intensity of the spectrums is depicted as arbitrary unit. As shown in FIG. 2, the excitation spectrum 200 includes a plurality of characteristic peaks, for example, the peak smaller than 400 nm, the peak between 400 nm and 550 nm, or the peak between 600 nm and 780 nm.

The characteristic peaks of the excitation spectrum 200 correspond to the light sources that are able to excite the phosphate phosphor. In some embodiments, the light source that is able to excite the phosphate phosphor may include an ultraviolet light source with wavelength between about 300 nm to 350 nm. In some embodiments, the light source that is able to excite the phosphate phosphor may include a blue light source with wavelength between about 400 nm to 550 nm. More specifically, the wavelength of the blue light source may be between about 450 nm to 500 nm. In some embodiments, the light source that is able to excite the phosphate phosphor may include a red light source with wavelength between about 600 nm to 780 nm. More specifically, the wavelength of the red light source may be between about 680 nm to 720 nm. In some embodiments, the light source that is able to excite the phosphate phosphor may include combinations of the above mentioned light sources.

As shown in FIG. 2, the emission spectrum 250 includes a characteristic peak. In some embodiments, the characteristic peak of the emission spectrum 250 is in a range of the near infrared light (for example, in a wavelength range between about 700 nm to 1400 nm). In some embodiments, the characteristic peak of the emission spectrum 250 may have a peak wavelength between about 780 nm to 950 nm.

The characteristic peak of the emission spectrum 250 corresponds to the infrared light emitted by the phosphate phosphor after excitation. The emission spectrum 250 includes a wide characteristic peak in FIG. 2, that is, the light emitted by the phosphate phosphor after excitation has a continuous wide range of the wavelength. In some embodiments, the wavelength range of the characteristic peak of the emission spectrum 250 may be between about 700 nm to 1100 nm. In some embodiments, the full width at half maximum (FWHM) of the characteristic peak of the emission spectrum 250 may be between about 90 nm to 200 nm.

The fluorescence feature of the phosphate phosphor may be descripted by the combination of the excitation spectrum 200 and the emission spectrum 250. In some embodiments, for example, when the phosphate phosphor is excited by a blue light with a wavelength about 460 nm, the phosphate phosphor emits a wide infrared light spectrum after absorption of the light. Furthermore, in these embodiments, the characteristic peak of the infrared light has a wavelength about 855 nm and a full width at half maximum about 156 nm.

In some embodiments, the ratio of the light energy absorbed and the infrared light energy emitted by the phosphate phosphor may be presented by an internal quantum efficiency (IQE). That is, the infrared light emitting efficiency of the phosphate phosphor. In some embodiments, the phosphate phosphor may have the internal quantum efficiency in a range of about 65% to 100%, for example, the internal quantum efficiency larger than 65%, larger than 75%, or larger than 85%.

The phosphate phosphor can emit infrared light after being excited by a light source. Therefore, the phosphate phosphor and the light source may be arranged in a light emitting device to form an infrared light emitting device. According to some embodiments of the disclosure, FIG. 3 and FIG. 4 respectively illustrates a cross sectional view of different light emitting devices including the phosphate phosphor. However, it should be appreciated that FIG. 3 and FIG. 4 are merely examples, and the light emitting device may include additional elements or various arrangements of the elements in other embodiments of the disclosure.

Figure 3:
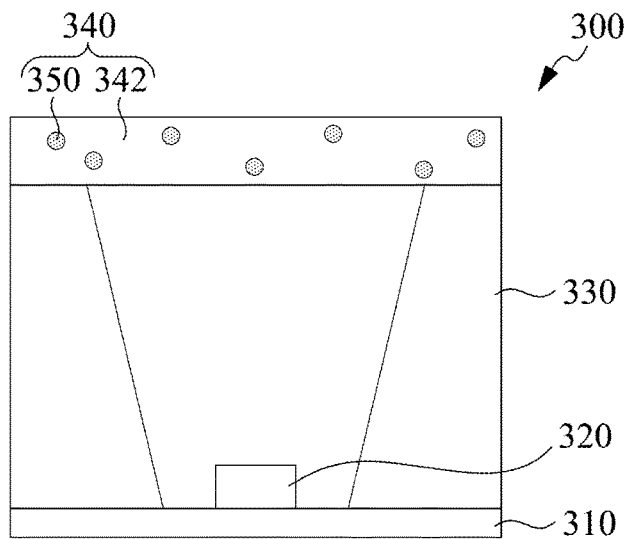
FIG. 3 illustrates a cross section view of the light emitting device including the phosphate phosphor according to some embodiments.
Figure 4:
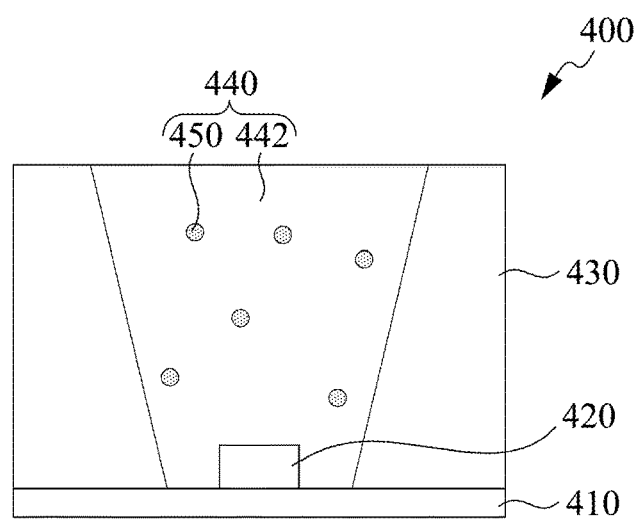
FIG. 4 illustrates a cross section view of the light emitting device including the phosphate phosphor according to some embodiments.

In FIG. 3, a light emitting device 300 includes a substrate 310, a light source 320 disposed on the substrate 310, a reflection wall 330 disposed on the contrary sides of the light source 320, and a wavelength converting layer 340 including a phosphate phosphor 350 and a transparent resin 342 above the light source 320. The phosphate phosphor 350 may receive the light from the light source 320 when the reflection wall 330 concentrates the light of the light source 320 on the wavelength converting layer 340.

In some embodiments, the phosphate phosphor 350 may include at least trivalent chromium for the activation center. When the phosphate phosphor 350 is excited by the light source 320, the phosphate phosphor 350 emits the infrared light. For example, the phosphate phosphor 350 may have a general formula $A_9B_{1-x}(PO_4)_7:xCr^{3+}$, and $0<x\leq1$, where A may include $Be^{2+}$, $Mg^{2+}$, $Ca^{2+}$, $Sr^{2+}$, $Ba^{2+}$, or the like, or combinations thereof, and B may include $Al^{3+}$, $Ga^{3+}$, $In^{3+}$, $Sc^{3+}$, $Y^{3+}$, $La^{3+}$, or the like, or combinations thereof.

According to some embodiments of the disclosure, the light emitted from the light source 320 may excite the phosphate phosphor 350. In some embodiments, the light source 320 may include a light emitting diode (LED). In some embodiments, the light source 320 may include an ultraviolet light source (for example, ultraviolet LED) with wavelength between about 300 nm to 350 nm. In some embodiments, the light source 320 may include a blue light source (for example, blue LED) with wavelength between about 400 nm to 550 nm. More specifically, the blue light wavelength of the light source 320 may be between about 400 nm to 550 nm. In some embodiments, the light source 320 may include a red light source (for example, red LED) with wavelength between about 600 nm to 780 nm. More specifically, the red light wavelength of the light source 320 may be between about 680 nm to 720 nm. In some embodiments, the light source 320 may include combinations of the above mentioned light sources.

According to some embodiments of the disclosure, the phosphate phosphor 350 emits an infrared light after being excited by the light source 320, which leads to the infrared light emitted by the light emitting device 300. In some embodiments, the peak wavelength of the infrared light emitted by the phosphate phosphor 350 may be between about 780 nm to 950 nm. In some embodiments, the infrared light emitted by the phosphate phosphor 350 may have a wide emission spectrum that its wavelength falls in a range of 700 nm to 1100 nm.

In FIG. 4, a light emitting device 400 includes a substrate 410, a light source 420 disposed on the substrate 410, a reflection wall 430 disposed on the contrary sides of the light source 420, and a wavelength converting layer 440 between the reflection wall 430. The wavelength converting layer 440 includes a phosphate phosphor 450 and a transparent resin 442, and the wavelength converting layer 440 covers and surrounds the light source 420. The reflection wall 430 may be used to reflect the light from the light source 420 toward the wavelength converting layer 440 or may be used to reflect the infrared light emitted by the phosphate phosphor 450 after excited by the light source 420 outside of the light emitting device 400.

In some embodiments, the light emitting device 400 is similar to the light emitting device 300 in FIG. 3, and the components of the phosphate phosphor 450 is similar to those of the phosphate phosphor 350. The phosphate phosphor 450 may emit an infrared light after excitation by the light source 420, and the infrared light has a wide emission spectrum between about 700 nm to 1100 nm.

Figure 5:
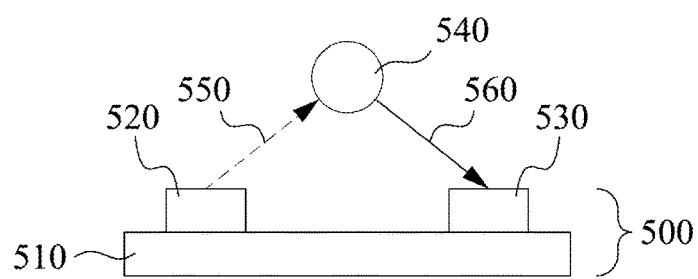
FIG. 5 illustrates a cross section view of the detecting device including the phosphate phosphor according to some embodiments.

The above mentioned light emitting devices emit wide infrared light spectrum, such that the light emitting devices may be applied in detecting devices for analysis, for example, infrared spectrometer. According to some embodiments of the disclosure, FIG. 5 illustrates a cross sectional view of a detecting device 500 including the phosphate phosphor. However, it should be appreciated that FIG. 5 is merely an example, and the detecting device 500 may include additional elements or various arrangements of the elements in other embodiments of the disclosure.

In FIG. 5, the detecting device 500 includes a carrier 510, a light emitting device 520 disposed on the carrier 510, and a sensing device 530 adjacent to the light emitting device 520 on the carrier 510. In other embodiments, the light emitting device 520 and the sensing device 530 may be disposed on different carriers, such that a sample 540 is between the light emitting device 520 and the sensing device 530. In some embodiments, the carrier 510 may be a circuit board.

In some embodiments, the light emitting device 520 is similar to the light emitting device 300 in FIG. 3 or the light emitting device 400 in FIG. 4. In other words, the light emitting device 520 includes a light source including an ultraviolet light source, a blue light source, or a red light source and a phosphate phosphor including an activation center of trivalent chromium. As a result of the infrared light emitting of the phosphate phosphor after excited by the light source, the light emitting device 520 may emit an infrared light 550. The infrared light 550 may have a wide emission spectrum with wavelength between about 700 nm to 1100 nm.

As shown in FIG. 5, the detecting device 500 emits the infrared light 550 by the light emitting device 520 toward the sample 540, which leads to the infrared light 560 reflected by the sample 540 and received by the sensing device 530. In the period of the contact between the infrared light 550 and the sample 540, portions of the infrared light 550 is absorbed by the sample 540, and the remained infrared light 550 is reflected by the sample 540 to form the infrared light 560. Therefore, the wavelength components and/or intensities of the infrared light 550 and those of the infrared light 560 reflected by the sample 540 are not exactly the same.

In other embodiments, the sample 540 may be disposed between the light emitting device 520 and the sensing device 530. The detecting device 500 emits the infrared light 550 by the light emitting device 520 toward the sample 540, and the infrared light 550 transmits through the sample 540 to form the infrared light 560 received by the sensing device 530. In the period of the transmitting of the infrared light 550 through the sample 540, portions of the infrared light 550 is absorbed by the sample 540, and the remained infrared light 550 transmits through the sample 540 to form the infrared light 560. Therefore, the wavelength components and/or intensities of the infrared light 550 and those of the infrared light 560 transmitting through the sample 540 are not exactly the same.

Figure 6:
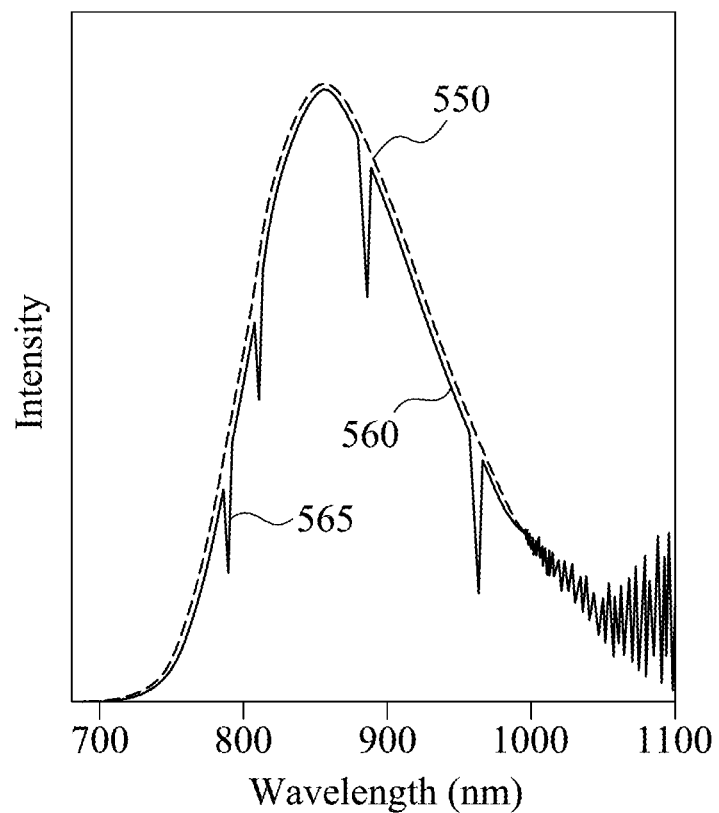
FIG. 6 illustrates a spectrum of the infrared light in FIG. 5 according to some embodiments.

According to the detecting device 500 including the phosphate phosphor in FIG. 5, FIG. 6 illustrates spectrums of the infrared light 550 and the infrared light 560, which the intensity of the spectrums is depicted as arbitrary unit. As shown in FIG. 6, the infrared light 550 is emitted by the light emitting device 520 that includes the phosphate phosphor. Therefore, the spectrum of the infrared light 550 is a wide infrared emission spectrum similar to the emission spectrum 250 in FIG. 2. After the absorption of portions of the infrared light 550 by the sample 540 in FIG. 5, the remained infrared light 550 forms the infrared light 560 in FIG. 6. The wavelength range of the infrared light 560 is similar to that of the infrared light 550. Since portions of the infrared light 550 are absorbed, the intensities of some wavelengths of the infrared light 560 are smaller. This forms the absorption peaks 565 of the infrared light 560 in the spectrum.

Referring to FIG. 5 and FIG. 6, the portions of the infrared light 550 absorbed by the sample 540 relate to the components of the sample 540. For example, if chemical molecules with a specific functional group appear in the sample 540, the sample 540 would absorb the portions of the infrared light 550 corresponding to the functional group, and this forms the absorption peaks 565 in the spectrum of the infrared light 560. Because the infrared light 560 forms the finger print spectrum due to the absorption peaks 565, the chemical molecules in the sample 540 may be qualitative analyzed, and they may be further quantitative analyzed by the intensity variation of the infrared light 560.

The infrared light 550 emitted by the detecting device 500 including the phosphate phosphor has a wide emission spectrum. Therefore, when portions of the infrared light 550 are absorbed by the sample 540, the infrared light 550 has a wide enough wavelength range for the sample 540 to absorb different regions of the infrared light 550, which forms an identifiable finger print spectrum. This advantage helps the identification of the components of the sample 540. In addition, the phosphate phosphor has the high internal quantum efficiency, which leads to the high intensity of the infrared light 550 emitted by the detecting device 500. This allows the detecting device 500 to detect clear spectrums to compare the infrared light 550 and the infrared light 560 or to monitor real-time chemical reaction without high power consumption or multiple scanning.

In some embodiments, the detecting device 500 is an individual device, that is, the detecting device 500 (for example, a handheld spectrometer) may individually measure the infrared light and display the result of the measurement. The detecting device 500 may further include analysis element (not shown, a process unit for example) or display element (not shown, a LED screen or a liquid crystal display (LCD) screen for example). When measuring the sample 540 by the detecting device 500, the optical signals of the infrared light 560 and/or the infrared light 550 are transformed into the electrical signals and output to the analysis element after the infrared light 560 is received by the detecting device 500. The analysis result of the infrared light 550 or the infrared light 560 from the analysis element may be output to the display element for result presenting.

For example, in the embodiment which the sample 540 is foodstuff, the detecting device 500 emits the infrared light 550 toward the sample 540 by the light emitting device 520, receives the infrared light 560 by the sensing device 530, and outputs the signals of both infrared lights to the analysis element. The analysis element calculates the infrared light intensity distribution of the infrared light 550 and/or the infrared light 560. If the wavelength distribution of the infrared light 560 is an identifiable finger print spectrum or an overlay of multiple finger print spectrums, the species or the contents of the ingredients (for example, nutrition ingredient or pesticide residue) in the sample 540 would be shown by the display element of the detecting device 500.

In some embodiments, the detecting device 500 may be built in an analysis system (not shown) which may include a plurality of the detecting devices 500 to simultaneously measure multiple samples 540. The analysis system may further include analysis elements (for example, cellphone, smart watch, tablet, computer, or the like), storage elements (for example, hard disk, server, cloud drive, or the like), or display elements. When measuring the sample 540 by the analysis system, the optical signals of the infrared light 550 and the infrared light 560 are transformed into the electrical signals and output to the analysis element by the detecting device 500 for calculation and analysis. The analysis result of the infrared light 550 and the infrared light 560 from the analysis element may be output to the display element for result presenting. The analysis result may be saved in the storage element to establish the analysis data base and improve the analysis ability of the analysis system.

For example, in the embodiment which the sample 540 is foodstuff, the detecting device 500 in the analysis system emits the infrared light 550 toward the sample 540 by the light emitting device 520, receives the infrared light 560, and outputs the signals of both infrared lights to the analysis element. The analysis element calculates the infrared light intensity distribution of the infrared light 550 and the infrared light 560. The analysis element then compares the calculating results with the infrared light spectrums corresponding to foodstuff ingredients in the storage element and identifies the species or the contents of the ingredients in the sample 540, which may be shown by the display element.

The phosphate phosphor provided by this disclosure includes at least an activation center of trivalent chromium, and the phosphate phosphor may be synthesized by simple forming method of solid sintering. The phosphate phosphor may emit infrared light spectrum after being excited by a light source. The light emitting device including the phosphate phosphor may be applied in the detecting device. The phosphate phosphor emits a wide infrared light spectrum with high emission efficiency, and therefore expands the application field of the infrared light detecting device.

The foregoing outlines features of several embodiments so that those skilled in the art may better understand the aspects of the present disclosure. It will be apparent to those skilled in the art that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A phosphate phosphor, comprising:
an activation center of trivalent chromium, wherein the phosphate phosphor emits an infrared light after excitation from a light,
wherein the phosphate phosphor has a general formula $Sr_9Sc_{1-x}(PO_4)_7:xCr^{3+}$, and $0<x\leq1$.

2. The phosphate phosphor of claim 1, wherein a crystal structure of the phosphate phosphor is monoclinic.

3. The phosphate phosphor of claim 1, wherein the light comprises an ultraviolet light, a blue light, or a red light.

4. The phosphate phosphor of claim 3, wherein the infrared light has an emission wavelength between about 700 nm to 1100 nm.

5. The phosphate phosphor of claim 3, wherein the infrared light has a peak with peak wavelength between about 780 nm to 950 nm and full width at half maximum between about 90 nm to 200 nm.

6. The phosphate phosphor of claim 1, wherein the phosphate phosphor has an internal quantum efficiency in a range of about 65% to 100%.

7. A light emitting device, comprising:
the phosphate phosphor of claim 1; and
a light source configured to emit the light.

8. The light emitting device of claim 7, wherein the light source comprises an ultraviolet light source configured to emit the light with wavelength between about 300 nm to 350 nm.

9. The light emitting device of claim 7, wherein the light source comprises a blue light source configured to emit the light with wavelength between about 400 nm to 550 nm.

10. The light emitting device of claim 7, wherein the light source comprises a red light source configured to emit the light with wavelength between about 600 nm to 780 nm.

11. The light emitting device of claim 7, wherein the light source comprises a light emitting diode.

12. The light emitting device of claim 7, wherein the infrared light has a wide emission spectrum with wavelength between about 700 nm to 1100 nm.

13. A detecting device, comprising:
a light emitting device, comprising:
the phosphate phosphor of claim 1; and
a light source configured to emit the light; and
a sensing device configured to receive the infrared light after external absorption or reflection.

14. The detecting device of claim 13, wherein the light source comprises an ultraviolet light source, a blue light source, or a red light source.

15. The detecting device of claim 13, wherein the infrared light emitted from the light emitting device has a wide emission spectrum with wavelength between about 700 nm to 1100 nm.

\* \* \* \* \*